(12) United States Patent
Sun et al.

(10) Patent No.: US 11,785,801 B2
(45) Date of Patent: Oct. 10, 2023

(54) DISPLAY SUBSTRATE WITH WATER-BLOCKING STRUCTURE, FABRICATION METHOD THEREOF, DISPLAY PANEL AND DISPLAY APPARATUS

(71) Applicant: BOE Technology Group Co., Ltd., Beijing (CN)

(72) Inventors: Zhongyuan Sun, Beijing (CN); Wei Wang, Beijing (CN); Lu Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/827,385

(22) Filed: May 27, 2022

(65) Prior Publication Data

US 2022/0293887 A1 Sep. 15, 2022

Related U.S. Application Data

(63) Continuation of application No. 16/330,931, filed as application No. PCT/CN2018/081935 on Apr. 4, 2018, now Pat. No. 11,380,866.

(30) Foreign Application Priority Data

Jan. 26, 2018 (CN) .......................... 201810076879.6

(51) Int. Cl.
*H10K 50/844* (2023.01)
*H10K 71/00* (2023.01)
(Continued)

(52) U.S. Cl.
CPC ........... *H10K 50/844* (2023.02); *H10K 71/00* (2023.02); *H10K 77/10* (2023.02); *H10K 59/12* (2023.02); *H10K 71/851* (2023.02)

(58) Field of Classification Search
CPC ...... H10K 50/844; H10K 71/00; H10K 77/10; H10K 59/12; H10K 71/851;
(Continued)

(56) References Cited

U.S. PATENT DOCUMENTS 10,038,038 B2  7/2018  Kim
10,249,844 B2  4/2019  Chou et al.
(Continued)

FOREIGN PATENT DOCUMENTS

CN  101336567 A  12/2008
CN  101853875 A  10/2010
(Continued)

OTHER PUBLICATIONS

Office Action dated May 31, 2022, issued in counterpart KR application No. 10-2021-7015378, with English translation. (11 pages).
(Continued)

*Primary Examiner* — Caleb E Henry
(74) *Attorney, Agent, or Firm* — WHDA, LLP

(57) ABSTRACT

The present disclosure is related to a display substrate. The display substrate may include a base substrate, a display structure on a display area of the base substrate, at least one blocking structure on a peripheral area around the display area of the base substrate, and a first water-blocking layer on the substrate. The first water-blocking layer may cover the display structure and the at least one blocking structure. The blocking structure may be configured to block cracks generated on the first water-blocking layer at a side of the blocking structure opposite from the display area from propagating to the display area.

15 Claims, 8 Drawing Sheets

(51) Int. Cl.
*H10K 77/10* (2023.01)
*H10K 59/12* (2023.01)

(58) Field of Classification Search
CPC .. H10K 2102/351; H10K 50/80; H10K 50/84; H01L 51/56; H01L 2251/558; H01L 2251/566; H01L 51/5253; H01L 51/5237; H01L 51/52; H01L 51/0096; H01L 27/3244; G09F 9/33; Y02E 10/549
See application file for complete search history.

(56) References Cited

U.S. PATENT DOCUMENTS

| | | | |
|---|---|---|---|
| 10,680,202 B2 * | 6/2020 | Shin | G02F 1/13394 |
| 10,930,887 B2 | 2/2021 | Lee et al. | |
| 2009/0273589 A1 | 11/2009 | Asano et al. | |
| 2014/0131683 A1 | 5/2014 | Kim et al. | |
| 2014/0217373 A1 | 8/2014 | Youn et al. | |
| 2015/0091030 A1 * | 4/2015 | Lee | H01L 51/5256 438/34 |
| 2015/0303406 A1 | 10/2015 | Kim | |
| 2016/0254489 A1 | 9/2016 | Sun et al. | |
| 2016/0351640 A1 * | 12/2016 | Lee | H01L 27/3276 |
| 2016/0365395 A1 | 12/2016 | Xu et al. | |
| 2017/0330921 A1 * | 11/2017 | Lee | H01L 27/3272 |
| 2018/0040850 A1 * | 2/2018 | Huang | H10K 50/844 |
| 2018/0138450 A1 | 5/2018 | Park et al. | |
| 2018/0150170 A1 * | 5/2018 | Oh | H01L 51/5284 |
| 2019/0097162 A1 * | 3/2019 | Wang | H10K 50/81 |
| 2019/0280243 A1 * | 9/2019 | Shin | H01L 27/3276 |

FOREIGN PATENT DOCUMENTS

| | | |
|---|---|---|
| CN | 106653818 A | 5/2017 |
| CN | 106784368 A | 5/2017 |
| CN | 106953029 A | 7/2017 |
| CN | 106960861 A | 7/2017 |
| CN | 106992263 A | 7/2017 |
| CN | 107180923 A | 9/2017 |
| CN | 206650079 U | 11/2017 |
| CN | 107452894 A | 12/2017 |
| CN | 107491209 A | 12/2017 |
| CN | 107527556 A | 12/2017 |
| CN | 206711922 U | 12/2017 |
| CN | 206849868 U | 1/2018 |
| EP | 3176826 A1 | 6/2017 |
| KR | 10-2008-0097984 A | 11/2008 |
| KR | 10-2014-0060152 A | 5/2014 |
| KR | 10-2014-0099164 A | 8/2014 |
| WO | 2007/088690 A1 | 8/2007 |

OTHER PUBLICATIONS

International Search Report dated Oct. 24, 2018, issued in counterpart application No. PCT/CN2018/081935. (10 pages).
Office Action dated Dec. 30, 2019, issued in counterpart CN Application No. 201810076879.6, with English Translation. (28 pages).
Office Action dated May 29, 2020, issued in counterpart KR Application No. 10-2019-7019897, with English translation (10 pages).
Office Action dated May 11, 2021, issued in counterpart CN Application No. 201810076879.6, with English Translation. (30 pages).
Office Action dated Aug. 31, 2021, issued in counterpart KR Application No. 10-2021-7015378, with English Translation. (11 pages).
Decision of Rejection dated Sep. 6, 2021, issued in counterpart CN Application No. 201810076879.6, with English Translation. (34 pages).
Office Action dated Oct. 5, 2021, issued in counterpart IN Application No. 201947037033, with English Translation. (7 pages).
Office Action dated Oct. 5, 2021, issued in counterpart JP Application No. 2019-536253, with English Translation. (12 pages).
Extended (Supplementary)European Search Report dated Sep. 29, 2021, issued in counterpart EP Application No. 18855127.9. (9 pages).
Notice of Allowance dated Dec. 28, 2022, issued in counterpart KR Application No. 10-2021-7015378, with English Translation. (11 pages).
Office Action dated Jan. 10, 2023, issued in counterpart JP Application No. 2022-059777, with English Translation. (12 pages).

* cited by examiner

DISPLAY SUBSTRATE WITH WATER-BLOCKING STRUCTURE, FABRICATION METHOD THEREOF, DISPLAY PANEL AND DISPLAY APPARATUS

CROSS-REFERENCE TO RELATED APPLICATIONS

This is a continuation of U.S. application Ser. No. 16/330,931 filed on Mar. 6, 2019, which claims benefit of the filing date of Chinese Patent Application No. 201810076879.6 filed on Jan. 26, 2018, the disclosure of which is hereby incorporated in its entirety by reference.

TECHNICAL FIELD

This invention relates to a display technology, and more particularly, to a display substrate, a fabrication method thereof, a display panel, and a display apparatus.

BACKGROUND

With the development of information technology, Organic Light Emitting Diodes (OLEDs) have been highly anticipated as next-generation displays. Compared with a LCD display, an OLED display has advantages such as faster response, higher contrast, wider viewing angle, and better low temperature resistance. However, since organic light-emitting materials such as organic electroluminescent elements and metal materials such as cathodes are extremely poor in water resistance, the performance of OLED devices can rapidly deteriorate due to moisture. Therefore, it is necessary to use packaging technology to block water and oxygen from penetrating the OLED devices.

BRIEF SUMMARY

Accordingly, one example of the present disclosure is a display substrate. The display substrate may include a base substrate, a display structure in a display area of the base substrate, at least one blocking structure in a peripheral area surrounding the display area of the base substrate, and a first water-blocking layer on the substrate, the first water-blocking layer covering the display structure and the at least one blocking structure. The at least one blocking structure may be configured to block cracks generated on the first water-blocking layer at a side of the blocking structure opposite from the display area from propagating to the display area. a thickness of the first water-blocking layer at a boundary of an interface between the blocking structure and the base substrate may be smaller than a thickness of the water-blocking layer covering a surface of the blocking structure farthest away from the base substrate. An area of an end surface of the blocking structure farthest away from the base substrate may be greater than an area of the interface between the blocking structure and the base substrate.

The blocking structure may include at least one protrusion on the base substrate and, along a protrusion direction of the protrusion, a cross-sectional area of the protrusion in a plane parallel to the base substrate may gradually increase. An orthogonal projection of the protrusion on a plane parallel to the base substrate may be circular.

In one embodiment, at least one groove may be provided on the peripheral area surrounding the display area of the base substrate. At least one sub-protrusion may be provided on a surface of the protrusion facing the at least one groove. The at least one sub-protrusion may be inside the at least one groove respectively.

In one embodiment, a groove may be provided on the peripheral area surrounding the display area of the base substrate; the protrusion may be disposed in the groove, a portion of the protrusion protruding from an opening of the groove; and an area of an end surface of the protrusion farthest away from the surface of the substrate may be greater than or equal to an area of the opening of the groove.

In one embodiment, at least one sub-protrusion may be provided on a bottom surface of the groove; at least one sub-groove may be provided on the surface of the protrusion facing the bottom surface of the groove; and the at least one sub-protrusion may be disposed inside the at least one sub-groove respectively.

In one embodiment, a groove may be provided on the peripheral area surrounding the display area of the base substrate; at least one island structure may be disposed in the groove; and the at least one protrusion may be disposed on the at least one island structure respectively.

In one embodiment, a groove may be provided on the peripheral area surrounding the display area of the base substrate; a filling portion may be provided on a surface of the protrusion opposite the groove; and the filling portion may be filled inside the groove.

The blocking structure may include a groove recessed from a surface of the base substrate on which the display structure is located and, along a recess direction of the groove, a cross-sectional area of the groove in a plane parallel to the base substrate may gradually increase. The base substrate may include a carrier board, and the groove may be disposed inside the carrier board. In another embodiment, the base substrate may include a carrier board and a dielectric layer disposed on the carrier board, and the groove may be disposed inside the dielectric layer.

The blocking structure may include at least one protrusion on the base substrate and, along a protrusion direction of the protrusion, a cross-sectional area of the protrusion in a plane parallel to the base substrate may first increase, and then decrease. A shape of orthogonal projection of the protrusion on a plane perpendicular to the base substrate may be an isosceles trapezoid. A shape of orthogonal projection of the groove on a plane perpendicular to the base substrate may be an isosceles trapezoid. The at least one blocking structure may include a plurality of blocking structures; and the plurality of the blocking structures may surround the display area at least one circle and is distributed at intervals.

The display substrate may further include a second water-blocking layer and an organic layer. The second water-blocking layer may cover the display structure and the blocking structure; the organic layer may cover a portion of the second water-blocking layer in the display area; and the first water-blocking layer may cover the organic layer and the second water blocking layer.

The display substrate may further include a positioning structure on the base substrate, the positioning structure being on a side of the blocking structure adjacent to the display structure and comprising an annular convex portion around the organic layer.

Another example of the present disclosure is a display panel. The display panel may include the display substrate according to one embodiment of the present disclosure.

Another example of the present disclosure is a display apparatus. The display apparatus includes a display panel according to one embodiment of the present disclosure.

Another example of the present disclosure is a method of fabricating a display substrate. The method may include providing a base substrate, forming a display structure in a display area of the base substrate, forming a blocking structure in a peripheral area of the base substrate around the display area, and forming a first water-blocking layer, the first water-blocking layer covering the display structure and the blocking structure. The blocking structure may be configured to block cracks generated on the first water-blocking layer at a side of the blocking structure opposite from the display area from propagating to the display area by thinning or disconnecting the water-blocking layer.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
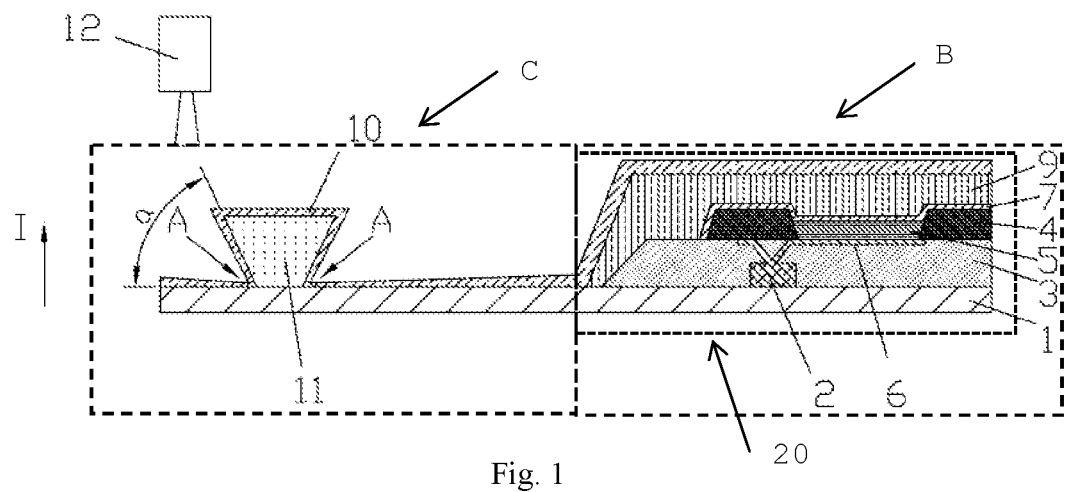
FIG. 1 is a sectional view of a display substrate according to an embodiment of the present disclosure.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-12B. When referring to the figures, like structures and elements shown throughout are indicated with like reference numerals. The described embodiments are part of the embodiments of the present disclosure, and are not all embodiments. According to the embodiments of the present disclosure, all other embodiments obtained by persons of ordinary skill in the art without creative efforts, belong to the protection scope of the disclosure.

In the description of the present disclosure, the terms "first" and "second" may be used for illustration purposes only and are not to be construed as indicating or implying relative importance or implied reference to the quantity of indicated technical features. Thus, features defined by the terms "first" and "second" may explicitly or implicitly include one or more of the features. In the description of the present disclosure, the meaning of "plural" is two or more unless otherwise specifically and specifically defined.

In the description of the specification, references made to the terms "one embodiment," "some embodiments," "exemplary embodiments," "example," "specific example," "some examples" and the like are intended to refer that specific features and structures, materials or characteristics described in connection with the embodiment or example that are included in at least one embodiment or example of the present disclosure. The schematic expression of the terms does not necessarily refer to the same embodiment or example. Moreover, the specific features, structures, materials or characteristics described may be included in any suitable manner in any one or more embodiments or examples.

In a conventional display substrate, a water-blocking layer is generally used to cover the entire substrate so as to block components on the substrate from being affected by water and oxygen. But this technique also causes the following problems:

In a process of manufacturing a display substrate, a plurality of display substrates are usually arranged on one base substrate. Therefore, it is necessary to cut the base substrate using a laser beam to eventually form separate display substrates. However, during the cutting using the laser beam, cracks are often generated near edges of the water-blocking layer, and the cracks may propagate to the display area, thereby resulting in poor packaging. For this reason, the cutting line of the laser beam must be located away from the boundary of the water-blocking layer, thereby resulting in a wide frame of the display substrate.

Figure 2A:
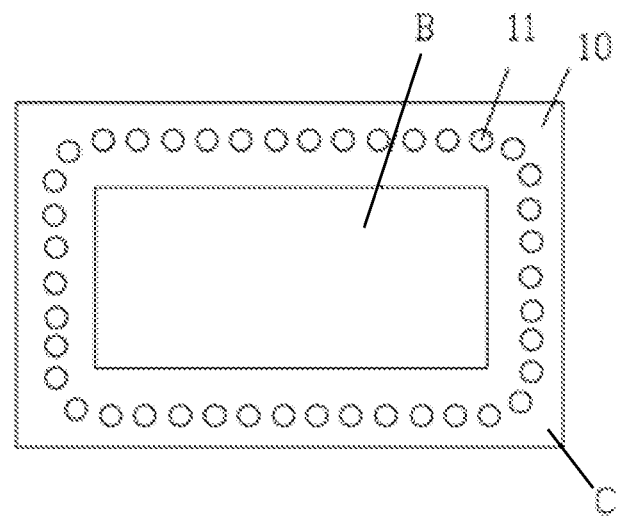
FIG. 2A is a top view of a display substrate according to an embodiment of the present disclosure.

FIGS. 1 and 2 show a display substrate according to one embodiment of the present disclosure. As shown in FIGS. 1 and 2, the display substrate provided by the first embodiment of the present disclosure includes a base substrate 1, a display structure 20 disposed in a display area B of the base substrate 1, and a first water-blocking layer 10 disposed on the substrate 1. The display structure 20 includes a thin film transistor 2, a planarization layer 3, an anode 6, an OLED organic light emitting layer 5, a pixel defining layer 4, and a cathode 7 which are sequentially disposed in a direction away from the base substrate 1. An organic layer 9 is further provided on the base substrate 1 and covers the above display structure. In one embodiment, the base substrate 1 includes a carrier board, and the carrier board may be a rigid carrier board or a flexible carrier board.

In one embodiment, the display substrate further includes a blocking structure disposed on the base substrate 1 and located in a peripheral area C around the display area B. The first water-blocking layer 10 covers the display structure and the blocking structure. The blocking structure is used to block cracks generated on the first water-blocking layer 10 at a side of the blocking structure opposite from the display area B during the cutting of the display substrate by a laser beam emitted by a laser cutter 12 from spreading to the display area B. As such, the width of the frame of the display substrate can be reduced to achieve a narrow frame design.

In one embodiment, the blocking structure includes a protrusion 11 disposed on the base substrate 1. The protrusion 11 is preferably made of a photosensitive material such as resin glue, which is conducive to forming a desired pattern by an exposure process. The protrusions 11 are provided directly on the surface of the base substrate 1 on which the display structure is located. Along the protrusion direction of the protrusions 11, that is, the I direction shown by the arrow in FIG. 1, a cross-sectional area of the protrusion 11 in a plane parallel to the base substrate 1 gradually increases. An acute angle α is formed between a side surface of the protrusion 11 and a surface of the base substrate 1. As such, in the process of manufacturing the first water-blocking layer 10, the first water-blocking layer 10 can be thinned or disconnected at position A, thereby blocking crack propagation. That is, a thickness of the first water-blocking layer at a boundary of an interface between the blocking structure and the base substrate is smaller than a thickness of the water-blocking layer covering a surface of the blocking structure farthest away from the base substrate. The boundary of the interface between the blocking structure and the base substrate is indicated by position A, as shown in FIG. 1.

It should be noted that the thickness of the first water-blocking layer in all the drawings does not represent the true thickness, and is only an exemplary description. The specific thickness depends on the process conditions, parameters, and the like. The figures only show that the thickness of the water-blocking layer in the area A is significantly smaller than the thickness of the water-blocking layer on a surface of the blocking structure parallel to the base substrate.

The so-called thinning means that the thickness of the first water-blocking layer 10 at the position A is smaller than that of other positions during the process of producing the first water-blocking layer 10. The so-called disconnecting means that the first water-blocking layer 10 is fully disconnected at the position A during the process of manufacturing the first water-blocking layer 10. That is, the portion of the first water-blocking layer 10 on the protrusion 11 and the portion on the base substrate 1 are completely disconnected at the position A.

In one embodiment, a shape of orthographic projection of the protrusion 11 on the plane perpendicular to the base substrate 1 is an isosceles trapezoid, which has advantage of being easy to make. In one embodiment, as shown in FIG. 1, the acute angle α formed between the side surface of the protrusion 11 and the surface of the base substrate 1 ranges from 20° to 60°. The height of the isosceles trapezoid ranges from 2 μm to 6 μm. Among them, 6 μm is the maximum height that the current process can reach. The isosceles trapezoidal protrusion 11 is preferably made of a negative photoresist, which can easily form the isosceles trapezoidal protrusion 11.

Figure 2B:
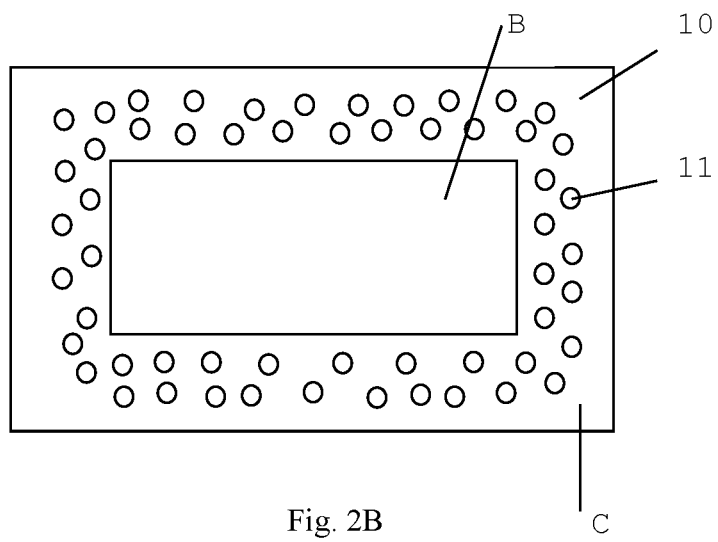
FIG. 2B is a top view of a display substrate according to an embodiment of the present disclosure.

In one embodiment, as shown in FIG. 2, there is a plurality of protrusions 11 surrounding the display area B and distributed at intervals. The orthogonal projection of the protrusion 11 on the plane parallel to the base substrate 1 is circular. Of course, the present disclosure is not limited to this. In practical applications, the plurality of protrusions 11 may surround the display area B two, three, or four times or more. In one embodiment, as shown in FIG. 2B, the plurality of protrusions 11 surround the display area B two times. The plurality of protrusions 11 are independent from each other. As such, the plurality of protrusions 11 can act to buffer stress when the base substrate 1 is bent.

Figure 3:
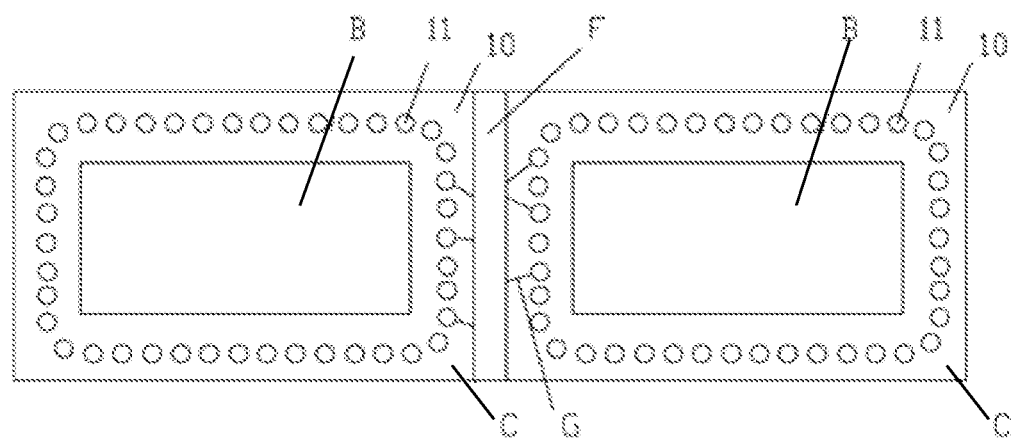
FIG. 3 is a top view of two adjacent display substrates according to an embodiment of the present disclosure.

In one embodiment, as shown in FIG. 3, in the process of manufacturing the display substrate, a plurality of display substrates are usually arranged on one base substrate. Therefore, it is necessary to use a laser cutter 12 to emit a laser beam to cut the base substrate 1 to form independent display substrates. When the laser beam emitted by the laser cutter 12 passes along a cutting line F between two adjacent display substrates, a crack G may be generated at an edge of the first water-blocking layer 10. The crack can propagate along the water-blocking layer to the display area, thereby forming a poor display panel. In order to solve this problem, the first water-blocking layer 10 can be thinned or disconnected by providing a circle of protrusions 11 in the peripheral region C, thereby preventing the crack G from spreading to the display region B. Furthermore, since a shape of the orthogonal projection of the protrusion 11 in the plane parallel to the base substrate 1 is circular and the circle is closed, the cracks propagated to the protrusions 11 are more easily blocked. In one embodiment, the diameter of the circular orthogonal projection ranges from 6 μm to 50 μm. Among them, 50 μm is the maximum diameter that can be achieved in the current process. More preferably, a distance between centers of two adjacent protrusions 11 ranges from 2.5 μm to 100 μm.

Figure 4:
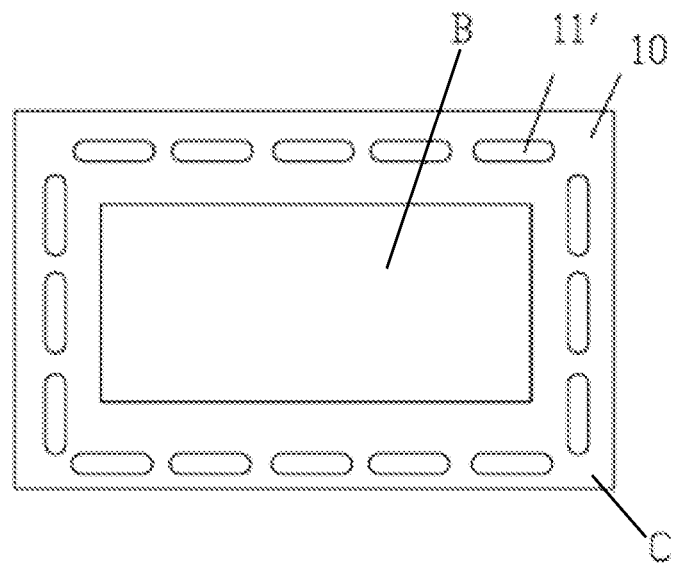
FIG. 4 is another top view of a display substrate according to an embodiment of the present disclosure.

In one embodiment, the shape of the orthogonal projection of the protrusion 11 on a plane parallel to the base substrate 1 may also be a shape having an aspect ratio of greater than 1 such as an ellipse or an oblong circle. A long axis of each protrusion 11 adopting the shape is parallel to a side of the display substrate opposite the protrusion. This can increase effective barrier length of each protrusion 11 so that the blocking effect of each protrusion 11 is enhanced. For example, as shown in FIG. 4, an orthogonal projection of the projection 11' on a plane parallel to the base substrate 1 is an oblong circle. Each of the protrusions 11' is opposite to one of side edges of the display substrate, and the long axis direction of the protrusion 11' and the opposite side edge of the display substrate are parallel to each other. In one embodiment, the protrusion is a closed circular structure that produces excellent blocking effect.

Figure 5:
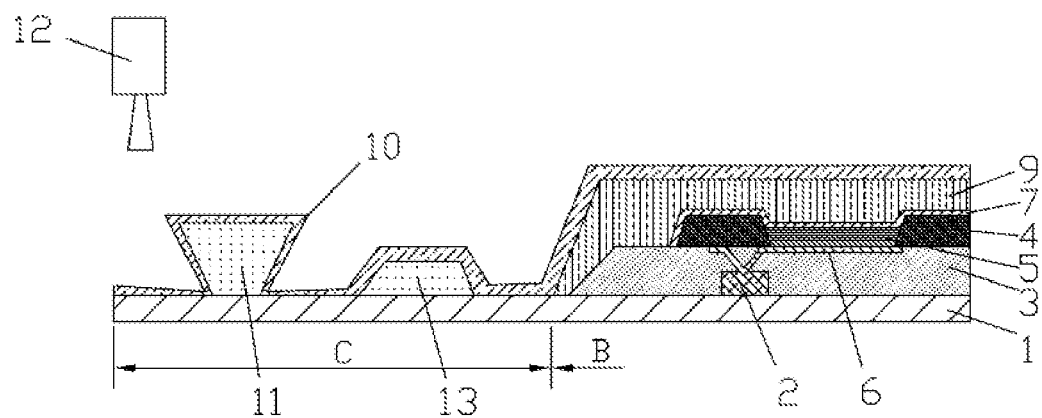
FIG. 5 is another sectional view of a display substrate according to an embodiment of the present disclosure.

In one embodiment, as shown in FIG. 5, a positioning structure 13 is provided on the base substrate 1 around the organic layer 9 for defining distribution area of the organic layer 9. Specifically, the positioning structure 13 includes an annular protrusion that is protruded relative to a surface of the base substrate 1 on which the display structure is located. In one embodiment, the positioning structure includes one annular protrusion. In another embodiment, the positioning structure includes a plurality of annual protrusions, and the plurality of annular protrusions is spaced apart from each other. The first water-blocking layer 10 covers the annular protrusions. Since the organic layer 9 is formed by ink jet printing, it has a certain fluidity during printing. Therefore, a flow range of the organic layer 9 can be easily defined by the positioning structure 13.

In one embodiment, along the protruding direction of the protrusion 11, a cross-sectional area of the protrusion 11 in a plane parallel to the base substrate 1 gradually increases. For example, the shape of orthographic projection of the protrusion 11 in the plane perpendicular to the base substrate 1 is an isosceles trapezoid. However, the present disclosure is not limited to this.

Figure 6:
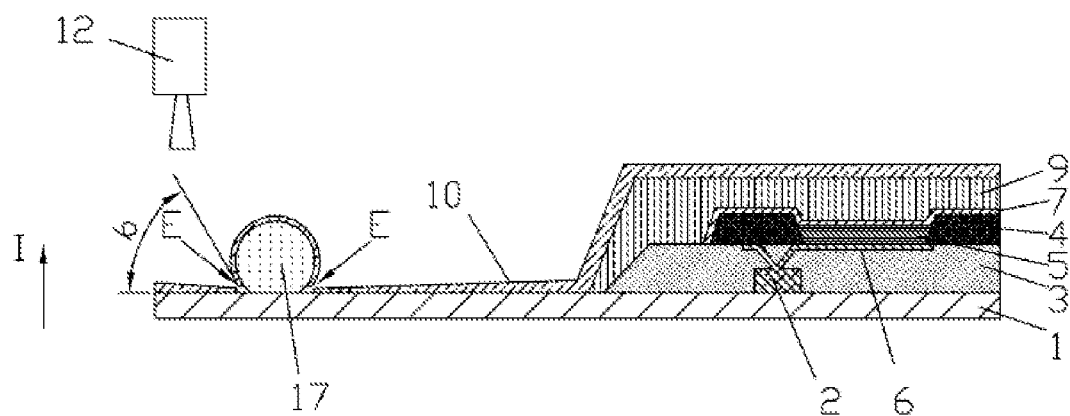
FIG. 6 is a sectional view of a display substrate according to an embodiment of the present disclosure.

In one embodiment, as shown in FIG. 6, a protrusion 17 is provided on the base substrate 1, and along the protrusion direction of the protrusion 17 (that is, the I direction shown by the arrow in FIG. 6), the cross-sectional area of the protrusion 17 in a plane parallel to the base substrate 1 first increases and then decreases. For example, the shape of orthogonal projection of the protrusion 11 on the plane perpendicular to the base substrate 1 is a circular arc shape. An acute angle b is formed between the arcuate surface of the arc-shaped protrusion 11 and a surface of the base substrate 1 on which the display structure is located. Since the acute angle b is smaller than the above-mentioned acute angle α, it is more advantageous to cut off the first water-blocking layer 10 at the position E. Of course, in an actual application, the shape of the orthogonal projection of the protrusion on the plane perpendicular to the base substrate 1 may also be any other shape as long as the first water-blocking layer can be thinned or disconnected.

Figure 7:
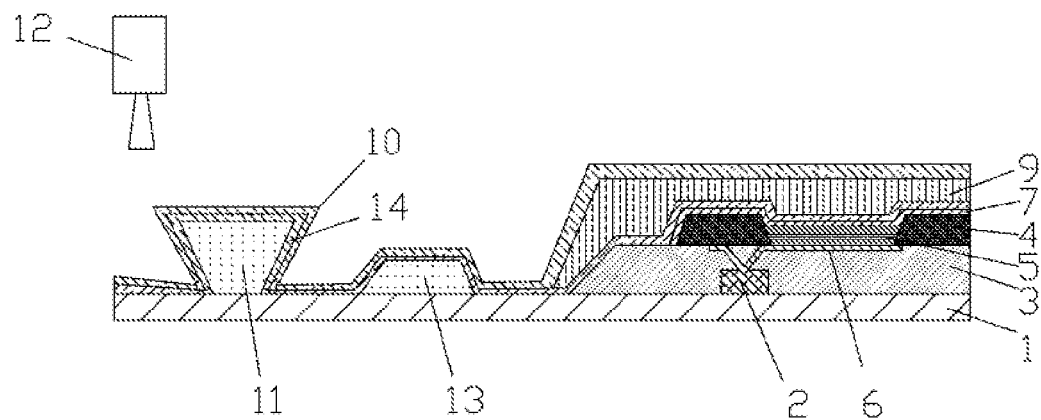
FIG. 7 is a cross-sectional view of a display substrate according to an embodiment of the present disclosure.

A display substrate provided by a second embodiment of the present disclosure, as shown in FIG. 7, is substantially the same as the display substrate provided by the above first embodiment except that a layer of water-blocking layer is added. In the following, the difference between these two embodiments is mainly described.

In one embodiment, the display substrate further includes a second water-blocking layer 14 covering the display structure and the blocking structure. The organic layer 9 covers the portion of the second water-blocking layer 14 in the display area C. The first water-blocking layer 10 covers the organic layer 9 and the second water-blocking layer 14 for directly blocking the trace amount of water vapor in the organic layer 9. Since the organic layer 9 can fill uneven portions of the display structure and eventually form a flat surface and the first water-blocking layer is disposed on the organic layer 9, film forming quality of the first water blocking layer is better and water resistance of the first water blocking layer is improved. In one embodiment, the second water-blocking layer 14 covers the positioning structure 13.

It should be noted that the thickness of the first water blocking layer and the thickness the second water blocking layer in all the drawings do not represent the true thickness, and is only an exemplary description. The specific thickness depends on the process conditions, parameters, and the like.

Figure 8:
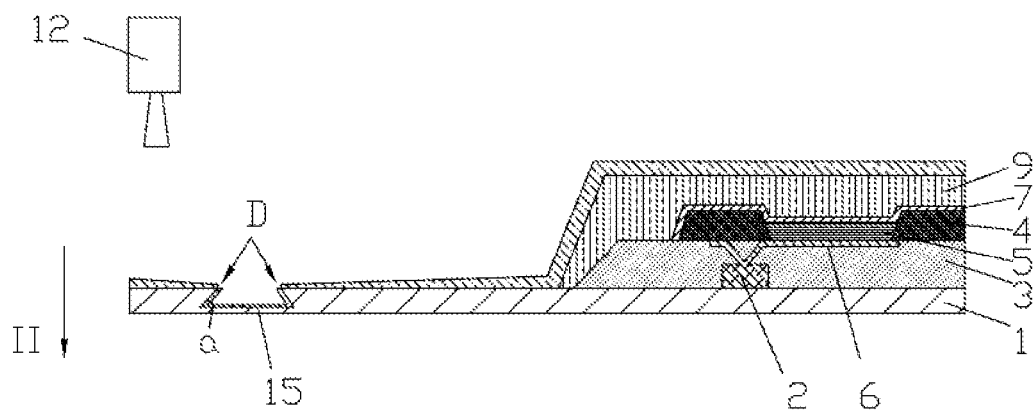
FIG. 8 is a sectional view of a display substrate according to an embodiment of the present disclosure.

The display substrate provided by the third embodiment of the present disclosure, as shown in FIG. 8, is substantially the same as the display substrate provided by the above first embodiment, except that the blocking structure is different. In the following, the difference between these two embodiments is mainly described.

In one embodiment, the blocking structure includes a groove 15 recessed toward the inside of the base substrate 1 from the surface of the base substrate 1 on which the display structure is located. Furthermore, along the recess direction of the concave portion 15 (i.e., the direction II shown by the arrow in FIG. 8), the cross-sectional area of the groove 15 in the plane parallel to the base substrate 1 gradually increases. This can form an acute angle a between the side surface of the groove 15 and the surface of the base substrate 1 on which the display structure is located. As such, in the process of fabricating the first water-blocking layer 10, the first water-blocking layer 10 can be thinned or disconnected in the position D, thereby avoiding crack propagation. Similarly to the protrusion 11 of the first embodiment, a shape of orthogonal projection of the groove 15 on the plane perpendicular to the base substrate 1 may be a shape which can thin or disconnect the water-blocking layer 10, such as an isosceles trapezoid, an arc shape, or the like. Similar to the protrusions 11 of the first embodiment, there may be a plurality of grooves 15. The plurality of grooves 15 surrounds the display area B by at least one circle and is spaced apart.

Figure 9:
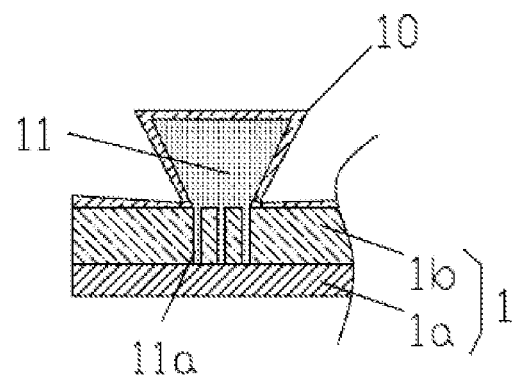
FIG. 9 is a partial cross-sectional view of a display substrate according to an embodiment of the present disclosure.

As shown in FIG. 9, a display substrate provided by the fourth embodiment of the present disclosure is an improvement on the basis of the above first embodiment. In the present embodiment, the base substrate 1 includes a carrier board 1a and a dielectric layer 1b provided on the carrier board 1a. Among them, the carrier board 1a may be a rigid carrier or a flexible carrier. The dielectric layer 1b may be made of an inorganic material such as silicon oxide, silicon nitride, or the like.

In this embodiment, the protrusion 11 is disposed on the dielectric layer 1b, and at least one groove recessed toward the inside of the dielectric layer 1b is disposed on the surface of the dielectric layer 1b on which the display structure is located. For example, FIG. 9 shows three grooves, and sub-protrusions 11a are provided on the surface of the protrusion 11 facing the grooves. That is, the sub-protrusions 11a are provided in the grooves in a one-to-one correspondence, and the sub-protrusions 11a match with the grooves. By matching, it means that the sub-protrusions 11a are partially filled or completely filled in the grooves.

By matching the sub-protrusions 11a with the grooves, the contact area between the protrusion 11 and the dielectric layer 1b can be increased, thereby increasing the adhesion of the two, eliminating risk of abnormal detachment, and thus improving the structural stability.

In one embodiment, the above-mentioned grooves penetrate through the thickness of the dielectric layer 1b, but the present disclosure is not limited thereto. The depth of the above-mentioned grooves may also be smaller than the thickness of the dielectric layer 1b.

In one embodiment, the base substrate 1 includes the carrier board 1a and the dielectric layer 1b provided on the carrier board 1a. However, only the carrier board 1a may be provided, and the above-described grooves may be provided in the carrier board 1a.

Figure 10A:
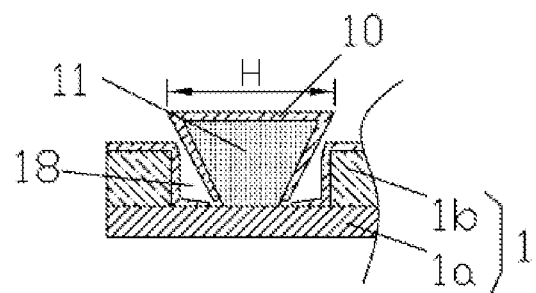
FIG. 10A is a partial cross-sectional view of a display substrate according to an embodiment of the present disclosure.

As shown in FIG. 10A, a display substrate provided by the fifth embodiment of the present disclosure is substantially the same as the display substrate provided by the first embodiment described above, except that the blocking structure is different. In the following, the difference between these two embodiments is mainly described.

In one embodiment, the base substrate 1 includes a carrier board 1a and a dielectric layer 1b provided on the carrier board 1a. The surface of the dielectric layer 1b on the side of the display structure is provided with a groove 18 recessed toward the inside of the dielectric layer 1b. The blocking structure includes a protrusion 11 disposed in the groove 18, a portion of which protrudes from the opening of the groove 18, that is, the height of the protrusion 11 is higher than the depth of the groove 18. The size H of the end surface of the protrusion 11 parallel to and distant from the plane of the dielectric layer 1b is greater than or equal to the size of the opening of the groove 18. In this way, the protrusion 11 can play the role of shielding the groove 18. During the process of forming the first water-blocking layer 10, a portion of the material deposited from the top to the bottom may not enter the groove 18 due to the shielding of the protrusion 11, so that the first water-blocking layer 10 is more likely to be thinned or disconnected at the position of the inclination angle of the protrusion 11.

Figure 10B:
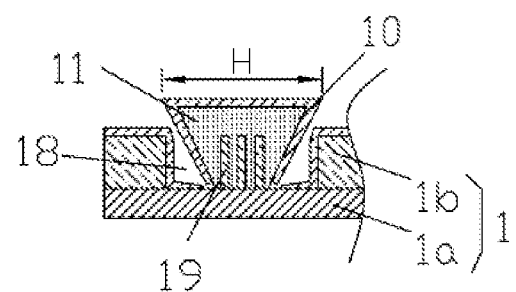
FIG. 10B is a partial cross-sectional view of a display substrate according to an embodiment of the present disclosure.

In one embodiment, as shown in FIG. 10B, on the basis of the display substrate provided in the above fifth embodiment, at least one sub-protrusion 19 is provided on the bottom surface of the groove 18. For example, FIG. 10B shows three sub-protrusions 19. In addition, sub-grooves are provided on the surface of the protrusion 11 opposite the bottom surface of the groove 18, and the sub-protrusions 19 are located in the sub-grooves in a one-to-one correspondence, and the sub-grooves and the sub-protrusions 19 match with each other. By matching, it is meant that the sub-protrusions 19 are partially filled or completely filled in the sub-grooves.

By mating the sub-grooves with the sub-protrusions 19, the contact area between the protrusions 11 and the dielectric layer 1b can be increased, thereby increasing the adhesion of the two, eliminating the risk of abnormal detachment, and thus improving the structural stability.

Figure 11:
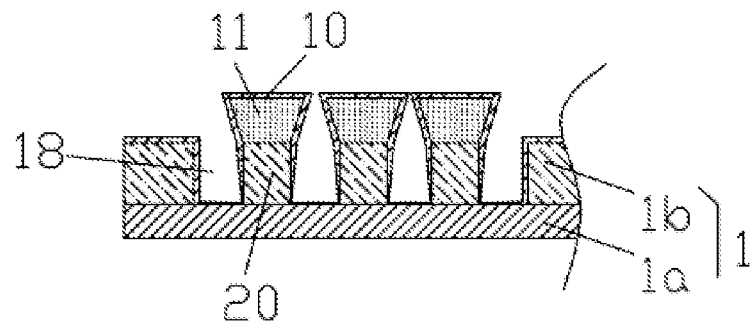
FIG. 11 is a partial cross-sectional view of a display substrate according to an embodiment of the present disclosure.

As shown in FIG. 11, a display substrate provided by the sixth embodiment of the present disclosure is substantially the same as the display substrate provided by the first embodiment described above, except that the blocking structure is different. In the following, the difference between these two embodiments is mainly described.

In one embodiment, the base substrate 1 includes a carrier board 1a and a dielectric layer 1b provided on the carrier board 1a. The surface of the dielectric layer 1b on which the display structure is located is provided with a groove 18 recessed toward the inside of the dielectric layer 1b. At least one island structure 20 is provided in the groove 18. The blocking structure includes protrusions 11, the number of which corresponds to the number of island structures 20, and the protrusions 11 are disposed on the island structures 20 in a one-to-one correspondence. By arranging the protrusion 11 on the island structure 20, the height of the bulge formed by the island structure 20 and the protrusion 11 is high. As such, in the process of fabricating the first water-blocking layer 10, the "climbing" difficulty of the deposition material of the first water-blocking layer 10 is increased. As a result, the deposition material can be prevented from being deposited on the sides and the bottom formed by the island structure 20 and the protrusion 11 to some extent. As a result, the first water-blocking layer 10 can be more easily thinned or disconnected.

Figure 12A:
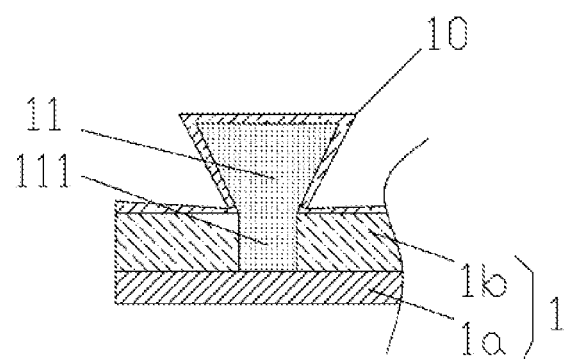
FIG. 12A is a partial cross-sectional view of a display substrate according to an embodiment of the present disclosure.

As shown in FIG. 12A, a display substrate provided by the seventh embodiment of the present disclosure is substantially the same as the display substrate provided by the first embodiment described above, except that the blocking structure is different. In the following, the difference between these two embodiments is mainly described.

In one embodiment, the base substrate 1 includes a carrier board 1a and a dielectric layer 1b provided on the carrier board 1a. The surface of the dielectric layer 1b on the side of the display structure is provided with a groove 18 recessed toward the inside of the dielectric layer 1b. The blocking structure includes a protrusion 11, and a filling portion 111 provided on a surface of the protrusion 11 facing the groove, and the filling portion 111 is filled in the groove.

An acute angle is formed between the side surface of the protrusion 11 and the surface of the dielectric layer 1b on which the display structure is located. As such, in the process of manufacturing the first water-blocking layer 10, the first water-blocking layer 10 can be thinned or disconnected so that crack propagation can be avoided. By the filling portion 111, the contact area between the protrusion 11 and the dielectric layer 1b can be increased, thereby increasing the adhesion of the two, eliminating the risk of abnormal detachment, and improving the structural stability.

Figure 12B:
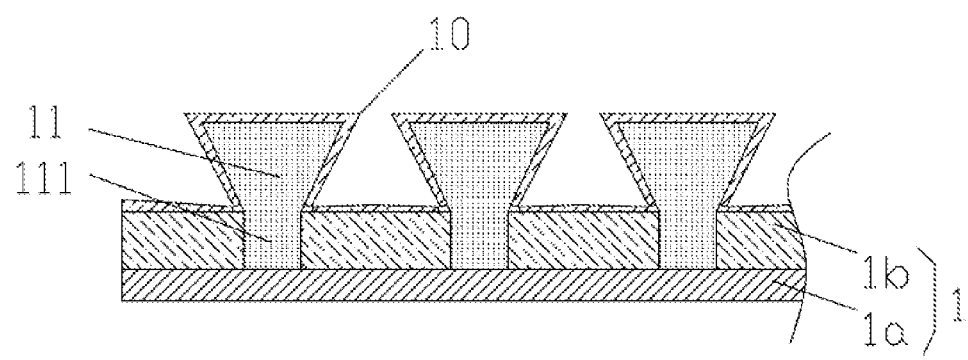
FIG. 12B is a partial cross-sectional view of a display substrate according to an embodiment of the present disclosure.

In one embodiment, as shown in FIG. 12B, on the basis of the display substrate provided in the above seventh embodiment, there is a plurality of protrusions 11. The plurality of protrusions 11 surrounds the display area B three times and is spaced apart. Of course, in practical applications, the plurality of protrusions 11 may also surround the display area B one, two, four, or more than four times.

In one embodiment, the display substrate provided by the present disclosure is provided with a blocking structure on a base substrate, the blocking structure is located in a peripheral area around the display area, and the first water-blocking layer covers the display structure and the blocking structure. The blocking structure is used to block cracks generated on the first water-blocking layer at a side of the blocking structure opposite from the display region from propagating to the display region by thinning or disconnecting the first water-blocking layer. As such, the width of the frame of the display substrate can be reduced, thereby realizing a narrow frame design.

Another embodiment of the present disclosure is a display panel. The display panel includes a display substrate according to one embodiment of the present disclosure.

According to the display panel provided by the present disclosure, by using the above display substrate according to one embodiment of the present disclosure, the width of the frame can be reduced, thereby achieving a narrow frame design.

Another embodiment of the present disclosure is a display apparatus. The display apparatus includes a display panel according to one embodiment of the present disclosure.

According to the display apparatus provided by the present disclosure, by using the above display panel according to one embodiment of the present disclosure, the width of the frame can be reduced, thereby achieving a narrow frame design.

Another embodiment of the present disclosure is a method of fabricating the display substrate. The method includes providing a base substrate; forming a display structure in a display area of the base substrate; forming a blocking structure in a peripheral area of the base substrate around the display area; and forming a first water-blocking layer covering the display structure and the blocking structure. The blocking structure is used to block cracks generated on the first water-blocking layer at a side of the blocking structure opposite from the display region from propagating to the display region by thinning or disconnecting the first water-blocking layer.

In the method of fabricating the display substrate according to one embodiment of the present disclosure, the blocking structure is used to block cracks generated on the first water-blocking layer at a side of the blocking structure opposite from the display region from propagating to the display region by thinning or disconnecting the first water-blocking layer. As such, the width of the frame of the display substrate can be reduced, thereby realizing the narrow frame design.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A display substrate, comprising
a base substrate, a display structure in a display area of the base substrate,
at least one blocking structure in a non-display area surrounding the display area of the base substrate,
a first water-blocking layer on the substrate, the first water-blocking layer covering the display structure and the at least one blocking structure;
wherein a thickness of the first water-blocking layer at a boundary of an interface between the at least one blocking structure and the base substrate is smaller than a thickness of the first water-blocking layer covering a surface of the at least one blocking structure farthest away from the base substrate; and
the at least one blocking structure comprises at least one protrusion on the base substrate.

2. The display substrate according to claim 1, wherein an acute angle α formed outside of the at least one protrusion between a side surface of the at least one protrusion and a surface of the base substrate ranges from 20° to 60°.

3. The display substrate according to claim 2, wherein the at least one blocking structure comprises at least two protrusions on the base substrate, and a distance between centers of any two adjacent protrusions of the at least two protrusions ranges from 2.5 μm to 100 μm.

4. The display substrate according to claim 1, wherein the at least one blocking structure comprises a groove recessed from a surface of the base substrate on which the display structure is located into an inner side of the base substrate.

5. The display substrate according to claim 4, wherein a cross-sectional area of the groove in a plane parallel to the base substrate has a length ranging from 6 to 50 μm.

6. The display substrate according to claim 4, wherein the base substrate comprises a carrier board and a dielectric layer provided on the carrier board.

7. The display substrate according to claim 6, wherein the carrier board is a flexible carrier board, and the dielectric layer includes inorganic material.

8. The display substrate according to claim 7, wherein the inorganic material comprises at least one of silicon oxide or silicon nitride.

9. The display substrate according to claim 4, wherein the groove has a depth less than a thickness of the base substrate.

10. The display substrate according to claim 1, wherein the display substrate further comprises an organic layer, the first water-blocking layer covers the organic layer, a positioning structure surrounds the organic layer, and the positioning structure is configured to define a distribution area of the organic layer; and
the positioning structure comprises one or more annular convex portions protruded from a surface of the base substrate at a side of the base substrate near the display structure.

11. The display substrate according to claim 10, wherein the first water-blocking layer covers the one or more annular convex portions.

12. The display substrate according to claim 1, wherein the at least one protrusion has a height in a range of 2 to 6 μm.

13. The display substrate according to claim 1, wherein an orthogonal projection of the at least one protrusion on a plane parallel to the base substrate is circular.

14. The display substrate according to claim 1, wherein a shape of orthogonal projection of the at least one protrusion on a plane perpendicular to the base substrate is an isosceles trapezoid.

15. A display apparatus comprising the display substrate of claim 1.

* * * * *